United States Patent
Sulem et al.

(10) Patent No.: US 10,429,929 B2
(45) Date of Patent: Oct. 1, 2019

(54) PIEZOELECTRIC ACTUATOR APPARATUS AND METHODS

(75) Inventors: Firmansyah Kuncoko Sulem, Waterloo (CA); James C. Infanti, Waterloo (CA)

(73) Assignee: BlackBerry Limited, Waterloo, Ontario (CA)

(*) Notice: Subject to any disclaimer, the term of this patent is extended or adjusted under 35 U.S.C. 154(b) by 1466 days.

(21) Appl. No.: 12/890,022

(22) Filed: Sep. 24, 2010

(65) Prior Publication Data

US 2012/0075198 A1    Mar. 29, 2012

(51) Int. Cl.
| | |
|---|---|
| *G06F 3/01* | (2006.01) |
| *H01L 41/09* | (2006.01) |
| *H01L 41/047* | (2006.01) |
| *H01L 41/053* | (2006.01) |

(52) U.S. Cl.
CPC .......... *G06F 3/016* (2013.01); *H01L 41/0475* (2013.01); *H01L 41/053* (2013.01); *H01L 41/0973* (2013.01); *Y10T 29/42* (2015.01)

(58) Field of Classification Search
CPC ... G06F 3/016; H01L 41/0475; H01L 41/053; H01L 41/0973; Y10T 29/42
USPC ...... 345/156, 168–169, 173–178; 340/407.1, 340/407.2; 463/30
See application file for complete search history.

(56) References Cited

U.S. PATENT DOCUMENTS

| | | | |
|---|---|---|---|
| 3,749,984 A | 7/1973 | Benyon, Jr. et al. | |
| 3,935,485 A | 1/1976 | Yoshida et al. | |
| 4,011,474 A | 3/1977 | O'Neill | |
| 4,361,778 A | 11/1982 | Luff et al. | |
| 4,404,489 A | 9/1983 | Larson, III et al. | |
| 5,374,449 A | 12/1994 | Buhlmann et al. | |
| 5,848,462 A | 12/1998 | Sera et al. | |
| 5,859,488 A * | 1/1999 | Okeshi ..................... | H03H 3/02 310/348 |
| 6,739,182 B2 | 5/2004 | Mueller et al. | |

(Continued)

FOREIGN PATENT DOCUMENTS

| | | |
|---|---|---|
| GB | 2115352 | 9/1983 |
| WO | 1995/020827 | 8/1995 |
| WO | 03047007 | 6/2003 |

OTHER PUBLICATIONS

"Piezoelectricity," Wikipedia article, published Mar. 15, 2010, last retrieved from http://en.wikipedia.org/wiki/Piezoelectricity on Oct. 13, 2010, 14 pages.

(Continued)

*Primary Examiner* — Nathan Danielsen
(74) *Attorney, Agent, or Firm* — Fish & Richardson P.C.

(57) ABSTRACT

Piezoelectric actuator apparatus and methods for providing tactile feedback are described herein. An example piezoelectric actuator assembly includes a support plate having a recessed well and conductive contact disposed within the recessed well of the support plate. A piezoelectric element has a first layer composed of an electrically conductive material and a second layer adjacent the first layer composed of a piezoelectric material. The piezoelectric element is disposed within the recessed well so that the first layer directly engages the conductive contact and the second layer is to be electrically coupled to a ground via a flexible conductive lead.

28 Claims, 4 Drawing Sheets

(56) References Cited

U.S. PATENT DOCUMENTS

| | | | |
|---|---|---|---|
| 7,067,756 B2* | 6/2006 | Cok | G06F 3/045 200/512 |
| 7,265,994 B2 | 9/2007 | Danvir et al. | |
| 7,499,036 B2* | 3/2009 | Flowers | 345/173 |
| 2002/0084721 A1 | 7/2002 | Walczak | |
| 2004/0027034 A1 | 2/2004 | Kawaguchi et al. | |
| 2004/0041497 A1* | 3/2004 | Hamada | H04R 17/00 310/330 |
| 2005/0054390 A1* | 3/2005 | Tuovinen | B06B 1/0215 455/575.1 |
| 2006/0082254 A1 | 4/2006 | Kita | |
| 2006/0238069 A1* | 10/2006 | Maruyama et al. | 310/316.01 |
| 2007/0103449 A1 | 5/2007 | Laitinen et al. | |
| 2007/0205701 A1* | 9/2007 | Grumm | A61B 5/4818 310/311 |
| 2008/0100568 A1* | 5/2008 | Koch et al. | 345/156 |
| 2008/0122315 A1 | 5/2008 | Maruyama et al. | |
| 2008/0280657 A1 | 11/2008 | Maenpaa et al. | |
| 2009/0026889 A1 | 1/2009 | Wolfer et al. | |
| 2009/0045700 A1* | 2/2009 | Sasaki | B06B 1/0603 310/348 |
| 2009/0154756 A1* | 6/2009 | Eaton et al. | 381/388 |
| 2010/0007531 A1* | 1/2010 | Fluhrer | H03K 17/964 341/34 |
| 2010/0090813 A1* | 4/2010 | Je | G06F 3/016 340/407.2 |
| 2010/0156245 A1 | 6/2010 | Barta et al. | |
| 2010/0156843 A1* | 6/2010 | Paleczny | G06F 3/016 345/174 |
| 2011/0095877 A1* | 4/2011 | Casparian | G06F 3/016 340/407.2 |
| 2011/0216013 A1* | 9/2011 | Siotis | 345/173 |

OTHER PUBLICATIONS

Mide, "Multifunction Alert Component," published 2009, last retrieved from http://www.mide.com/technology/omnicom.php on Oct. 13, 2010, 2 page.

Piezo Systems, Inc., "Piezoelectic Bending Disk Actuators," published 2008, last retrieved from http://www.piezo.com/prodbm5disk.html on Oct. 13, 2010, 2 pages.

European Patent Office, "European Search Report," issued in connection with European application serial No. 10179456.8, dated Jun. 7, 2011, 5 pages.

European Search Report in European Application No. 12181404.0, dated Oct. 29, 2012, 5 pages.

European Patent Office, "Intention to Grant," issued in connection with European application serial No. 10 179 456.8, dated Dec. 13, 2012, 5 pages.

* cited by examiner

PIEZOELECTRIC ACTUATOR APPARATUS AND METHODS

FIELD OF DISCLOSURE

The present disclosure relates to piezoelectric actuators, including but not limited to, piezoelectric actuator apparatus and methods.

BACKGROUND

Electronic devices, including portable electronic devices, have gained widespread use and may provide a variety of functions including, for example, telephonic, electronic messaging, and other personal information manager (PIM) application functions. Portable electronic devices include, for example, several types of mobile stations such as simple cellular telephones, smart telephones, wireless personal digital assistants (PDAs), and laptop computers with wireless 802.11 or Bluetooth capabilities.

Portable electronic devices such as PDAs or smart telephones are generally intended for handheld use and ease of portability. Smaller devices are generally desirable for portability. A touch-sensitive display, also known as a touchscreen display, is particularly useful on handheld devices, which are small and have limited space for user input and output. The information displayed on the touch-sensitive displays may be modified depending on the functions and operations being performed. With continued demand for decreased size of portable electronic devices, touch-sensitive displays continue to decrease in size. In addition to the touch-sensitive display, electronic devices often include a keypad to input commands or information.

Some electronic devices use piezoelectric elements or disks to provide haptic feedback to a user of an electronic device via, for example, a touch-sensitive display. Typically, piezoelectric elements have a conductive layer or shim and a piezoelectric material layer. In one known actuator assembly, a set of four piezo disks are disposed within shallow wells formed in a support plate. Flexible conductive leads are coupled to both the shim and the piezoelectric material layer of each piezoelectric element via, for example, conductive adhesive, soldering, etc. Such flexible conductive leads are susceptible to cracking, which can result in electrical arcing, poor mechanical response and/or insufficient tactile feedback. Additionally, coupling the flexible conductive leads to the both the shim and the piezoelectric material layer significantly increases manufacturing complexity and costs.

Thus, it is desired to provide an improved piezoelectric actuator apparatus while reducing manufacturing complexity and costs.

DETAILED DESCRIPTION

Piezoelectric actuator apparatus to provide tactile or haptic feedback to, for example, a touch-sensitive display are described herein. For example, the actuators may be controlled via a processor or other circuitry to provide tactile feedback via the touch-sensitive display to simulate, for example, depression or actuation of a switch that may be utilized as part of a physical key of a keyboard (e.g., a dome switch, snap switch, etc.) or any other type of switch that may be simulated. Such tactile feedback may be provided in response to depression and release of the touch-sensitive display (e.g., a liquid crystal display).

An example piezoelectric actuator apparatus described herein includes a support plate having at least one recessed well to receive a conductive contact that directly engages a conductive layer of a piezoelectric element to provide a charge to the piezoelectric element. The support plate includes a conductive trace or path between the conductive contact and a connector of the support plate to electrically couple the conductive layer of the piezoelectric element to, for example, a switch, a voltage source (e.g., a battery), an integrated circuit, etc. The conductive contact is coupled to the connector via a dedicated conductive trace or path so that a first piezoelectric element coupled to the support plate is electrically isolated from a second piezoelectric element coupled to the support plate. In this manner, each piezoelectric elements coupled to the support plate may be analyzed and/or activated individually, simultaneously, intermittently and/or any other desired pattern.

Further, the piezoelectric actuator apparatus described herein reduce manufacturing complexity and costs. In particular, the example piezoelectric actuator apparatus eliminates the need to couple or attach a flexible conductive lead to the conductive layer of the piezoelectric element. Such elimination of the conductive lead significantly improves reliability and/or longevity of the electrical connection between the conductive layer of the piezoelectric element and the conductive contacts of the support plate. Additionally or alternatively, eliminating a flexible conductive lead to the conductive layer of the piezoelectric element significantly reduces manufacturing complexity and costs. In the examples described herein, only the piezoelectric material of the piezoelectric actuator is coupled to, for example, a ground via a flexible conductive lead.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the examples described. The description is not to be considered as limited to the scope of the examples described herein.

The disclosure generally relates to electronic devices such as, for example, a portable electronic device in the examples described herein. Examples of portable electronic devices include mobile, or handheld, wireless communication devices such as pagers, cellular phones, cellular smartphones, wireless organizers, personal digital assistants, wirelessly enabled notebook computers, and so forth. The portable electronic device may also be a portable electronic device without wireless communication capabilities, such as a handheld electronic game device, digital photograph album, digital camera, or other device.

Figure 1:
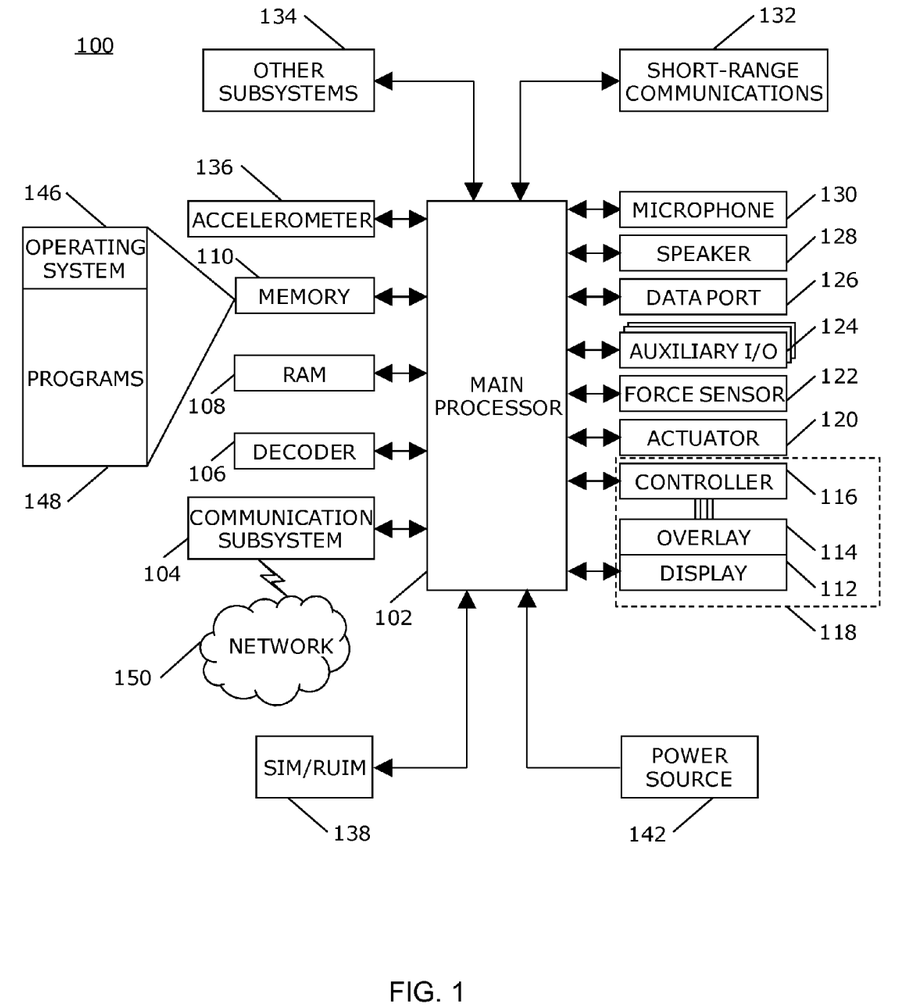
FIG. 1 is a block diagram of a portable electronic device in accordance with the disclosure.

A block diagram of an example of a portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as Random Access Memory (RAM) 108, memory 110, a display 112 with a touch-sensitive overlay 114 operably connected to an electronic controller 116 that together comprise a touch-sensitive display 118, one or more actuator apparatus 120, one or more force sensors 122, an auxiliary input/output (I/O) subsystem 124, a data port 126, a speaker 128, a microphone 130, short-range communications 132, and other device subsystems 134. User-interaction with a graphical user interface is performed through the touch-sensitive overlay 114. The processor 102 interacts with the touch-sensitive overlay 114 via the electronic controller 116. Information, such as text, characters, symbols, images, icons, and other items that may be displayed or rendered on a portable electronic device, is displayed on the touch-sensitive display 118 via the processor 102. The processor 102 may interact with an accelerometer 136 that may be utilized to detect direction of gravitational forces or gravity-induced reaction forces.

To identify a subscriber for network access, the portable electronic device 100 uses a Subscriber Identity Module or a Removable User Identity Module (SIM/RUIM) card 138 for communication with a network, such as the wireless network 150. Alternatively, user identification information may be programmed into memory 110.

The portable electronic device 100 includes an operating system 146 and software programs or components 148 that are executed by the processor 102 and are typically stored in a persistent, updatable store such as the memory 110. Additional applications or programs may be loaded onto the portable electronic device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 130 converts audible information into electrical signals for processing.

The touch-sensitive display 118 may be any suitable touch-sensitive display, such as a capacitive, resistive, infrared, surface acoustic wave (SAW) touch-sensitive display, strain gauge, optical imaging, dispersive signal technology, acoustic pulse recognition, and so forth, as known in the art. A capacitive touch-sensitive display includes a capacitive touch-sensitive overlay 114. The overlay 114 may be an assembly of multiple layers in a stack including, for example, a substrate, a ground shield layer, a barrier layer, one or more capacitive touch sensor layers separated by a substrate or other barrier, and a cover. The capacitive touch sensor layers may be any suitable material, such as patterned indium tin oxide (ITO).

One or more touches, also known as touch contacts or touch events, may be detected by the touch-sensitive display 118. The processor 102 may determine attributes of the touch, including a location of a touch. Touch location data may include an area of contact or a single point of contact, such as a point at or near a center of the area of contact. The location of a detected touch may include x and y components, e.g., horizontal and vertical components, respectively, with respect to one's view of the touch-sensitive display 118. For example, the x location component may be determined by a signal generated from one touch sensor, and the y location component may be determined by a signal generated from another touch sensor. A signal is provided to the controller 116 in response to detection of a touch. A touch may be detected from any suitable object, such as a finger, thumb, appendage, or other items, for example, a stylus, pen, or other pointer, depending on the nature of the touch-sensitive display 118. Multiple simultaneous touches may be detected. The touches may be detected by the force sensor 122, which generates a signal to the processor 102. The processor 102, in turn, provides a signal to actuate or activate the actuators 120 to provide tactile feedback to a user.

Figure 2A:
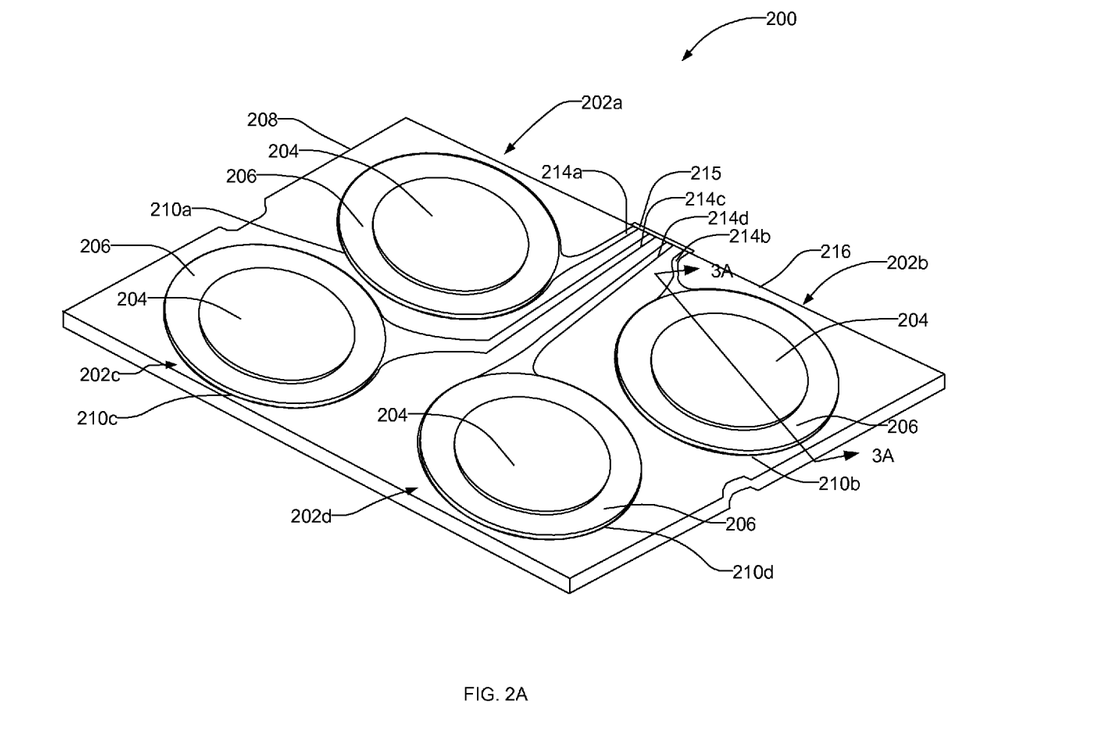
FIG. 2A is a schematic illustration of an example piezoelectric actuator apparatus described herein that may be used to implement the example portable electronic device of FIG. 1.
Figure 2B:
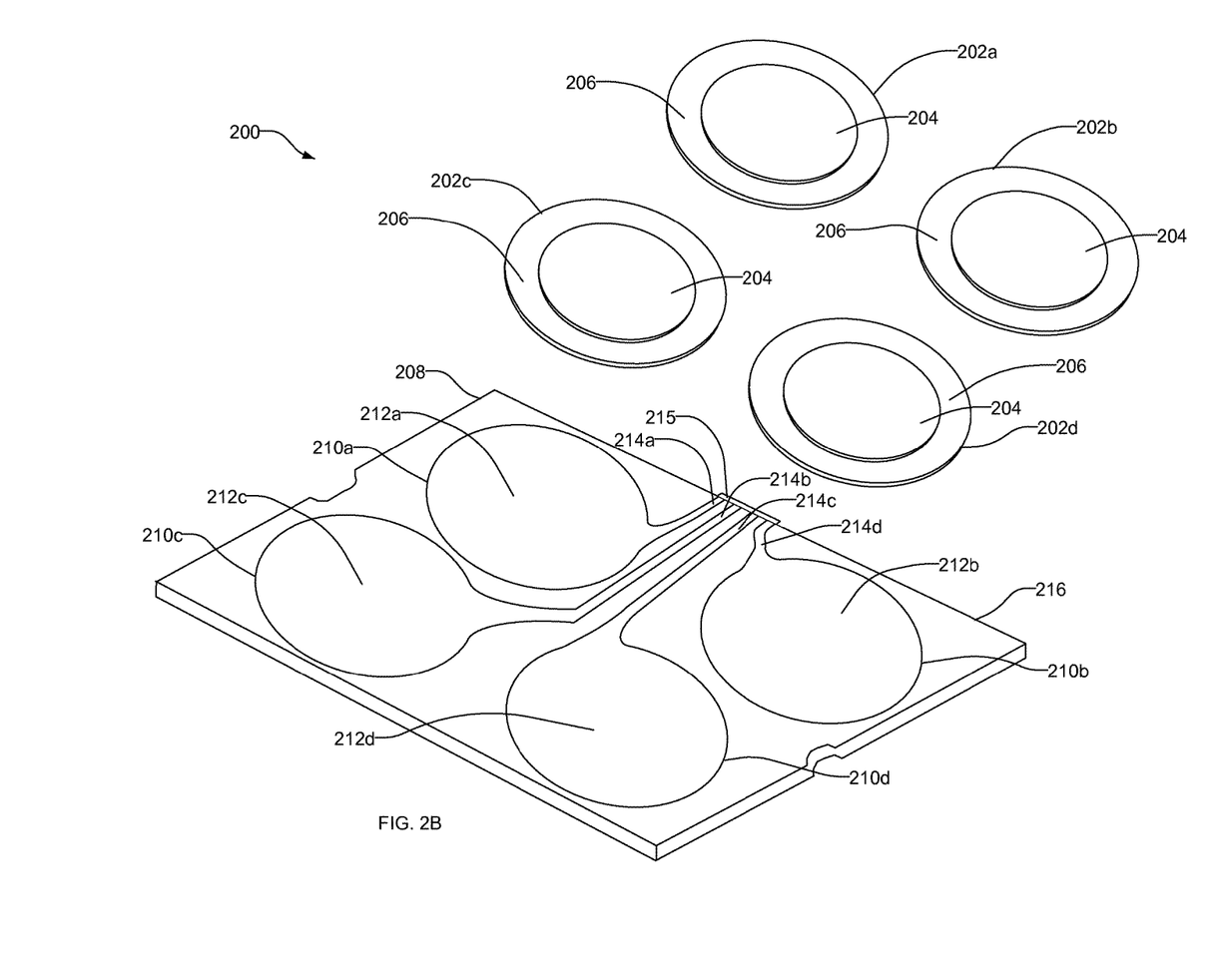
FIG. 2B is an exploded view of the example piezoelectric actuator apparatus of FIG. 2A.

FIG. 2A illustrates an example piezoelectric actuator assembly 200 described herein that may be used to implement the actuator 120 of FIG. 1. FIG. 2B illustrates an exploded view of the example piezoelectric actuator assembly 200 of FIG. 2A. Referring to FIGS. 2A and 2B, in this particular example, the piezoelectric actuator assembly 200 comprises one or more piezoelectric (piezo) elements or devices 202a-d that provide tactile feedback to the touch-sensitive display 118. As described in greater detail below, each piezoelectric elements 202a-d may be controlled independently from each other. For example, the piezoelectric element 202a may be activated prior to, or instead of, the piezoelectric element 202b to provide a first tactile feedback. In another example, the piezoelectric element 202a may be activated to provide a first tactile feedback (e.g., a first force or vibration) that is different than a tactile feedback (e.g., a second force or vibration) provided by the piezoelectric element 202b.

In this particular example, each piezoelectric elements 202a-d comprises a piezoelectric material or layer 204 adjacent a second layer material or substrate 206. The piezoelectric material 204 is fastened or adhered to the substrate 206 via, for example, adhesive, lamination, laser welding, and/or by other suitable fastening method(s). The substrate 206 is composed of an electrically conductive material to provide an electrical connection to the piezoelectric material 204. The substrate 206, which may also be referred to as a shim, may be comprised of nickel or any other suitable material such as, for example, stainless steel, brass, etc. The piezoelectric material 204 may be a piezoelectric (PZT) ceramic disk, and may have a single layer of the piezoelectric material 204 or any suitable number of piezoelectric materials or layers composed of, for example, ceramic, lead zirconate titanate or any other suitable piezoelectric material(s).

The piezoelectric actuator assembly 200 includes a chassis or support plate 208 composed of a non-conducting or electrical insulating material such as, for example, a hard plastic. In this particular example, the support plate 208 is a unitary piece or structure composed of a hard plastic material. In other examples, the support plate 208 may be a multi-layer support structure having a support layer composed of, for example, metal and an insulating layer composed of, for example, a plastic material. For example, the support layer composed of metal may be formed via stamping and may be covered by the insulating layer via over molding or vacuum molding.

In this particular example, the support plate 208 includes a plurality of recessed wells or shallow tubs 210a-d. The recessed wells 210a-d are formed with the non-conducting or electrical insulating material or layer 204 of the support plate 208. A plurality of conductive contacts 212a-d such as a copper element or disk are disposed within or coupled to the respective recessed wells 210a-d. The recessed wells 210a-d may have a depth that may partially or fully receive the piezoelectric elements 202a-d. In some examples, the conductive contacts 212a-d may be integrally formed with the support plate 208. For example, the support plate 208 may be composed of, for example, metal (e.g., aluminum, copper, etc.) that may be covered by an electrical insulating material (e.g., a plastic material) that includes openings that substantially align with the recessed wells 210a-d to enable the conductive contacts 212a-d (or portions of the metal support plate 208) to be exposed via the openings of the insulating material.

The piezoelectric elements 202a-d are coupled to the respective conductive contacts 212a-d, which are disposed within the recessed wells 210a-d. More specifically, the substrate 206 of the piezoelectric elements 202a-d is coupled to the conductive contacts 212a-d to provide an electrical connection to the piezoelectric elements 202a-d. For example, the substrate 206 is fastened or coupled (e.g., directly coupled) to the conductive contacts 212a-d via, for example, an electrically conductive bonding agent, adhesive, cement, soldering, or any other suitable methods. The support plate 208 mechanically stabilizes the piezoelectric elements 202a-d and electrically isolates or insulates the piezoelectric elements 202a-d from other electrical components adjacent the conductive contacts 212a-d and/or stray environmental changes. Further, the support plate 208 electrically isolates the piezoelectric elements 202a-d from each other. Additionally, in contrast to known piezoelectric actuators, the piezoelectric actuator assembly 200 need not include a flexible conductive lead coupled to the substrate 206 (e.g., the conductive layer) of the piezoelectric elements 202a-d.

The support plate 208 also includes a plurality of conductive traces or connecting strip conductors 214a-d (e.g., copper strips) between each of the conductive contacts 212a-d and, for example, a connector 215 adjacent an edge 216 of the support plate 208 to provide an electrical connection to the conductive contacts 212a-d. For example, the conductive traces 214a-d electrically couple the piezoelectric actuator assembly 200 to the connector. More specifically, each of the conductive traces 214a-d provides a dedicated electrical trace or conductive strip between the respective conductive contacts 212a-d and the connector adjacent the edge 216. Thus, each of the piezoelectric elements 202a-d has a dedicated conductive path to electrically couple the piezoelectric elements 202a-d to, for example, the processor 102. The connector may be coupled to the conductive traces 214a-d via a fastener, soldering or any other suitable method(s). Although not shown, the support plate 208 may be disposed on or coupled to a base. The base may be a printed circuit board or other suitable structure.

As shown in this particular example, the piezoelectric actuator assembly 200 includes four piezoelectric elements 202a-d directly coupled to four conductive contacts 212a-d via the substrate 206 of the piezoelectric elements 202a-d. Although not shown, in other examples, the piezoelectric actuator assembly 200 may include any number of piezoelectric elements. For example, the piezoelectric actuator assembly 200 may include only one piezoelectric element, a recessed well, a conductive contact and an electrical trace. Further, in some examples, a plurality of piezoelectric actuator assemblies 200 may be coupled to the portable electronic device 100.

Figure 3A:
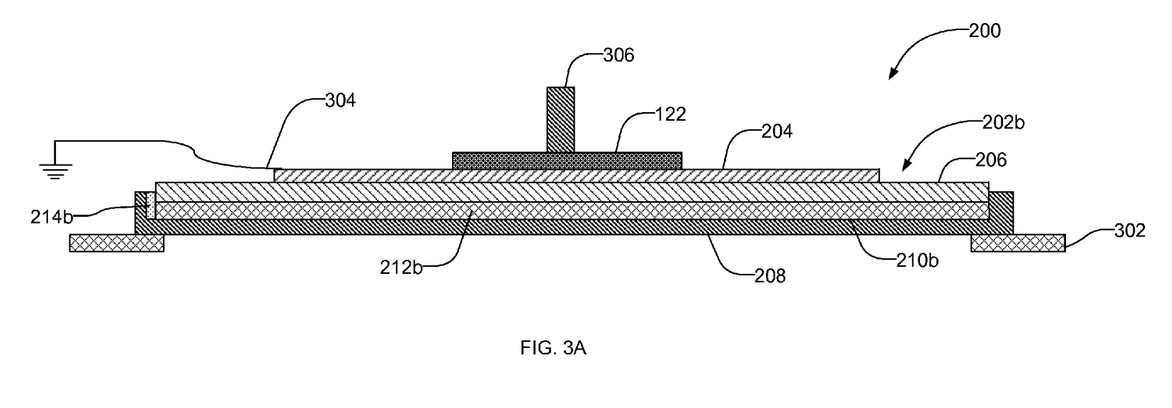
FIG. 3A is a cross-sectional view of a portion of the example piezoelectric actuator apparatus of FIGS. 2A and 2B installed with the portable electronic device of FIG. 1.
Figure 3B:
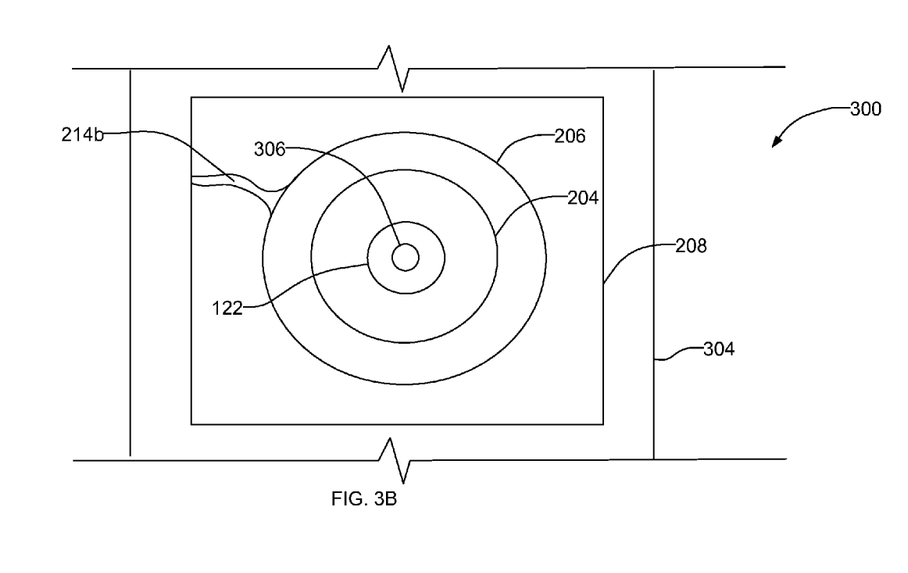
FIG. 3B is a plan view of the example assembly of FIG. 3A.

FIG. 3A illustrates a cross-sectional view of a portion of the piezoelectric actuator assembly 200 taken along line 3A-3A of FIG. 2A when installed with the mobile electronic device 100 of FIG. 1. FIG. 3B illustrates a plan view of the example shown in FIG. 3A. The piezoelectric actuator assembly 200 may be disposed within a housing 302 of the electronic device 100 between the housing 302 and the touch-sensitive display (not shown). The housing 302 may be comprised of a thermoplastic polymer such as polycarbonate, or other suitable materials such as plastic, fiberglass, and so forth. The piezoelectric material or layer 204 of the piezoelectric element 202b is electrically coupled to a ground via, for example, a flexible conductive lead 304.

In some examples, the force sensor 122 may be disposed adjacent the piezoelectric actuator assembly 200. The force sensor 122 may be a force-sensitive resistor, a strain gauge, a piezoelectric or piezoresistive device, a pressure sensor, or any other suitable device(s). Force as utilized throughout the specification, including the claims, refers to force measurements, estimates, and/or calculations, such as pressure, deformation, stress, strain, force density, force-area relationships, thrust, torque, and other effects that include force or related quantities. Although not shown, a conductor or flex electrically connects the force sensor 122 to the processor 102. Also, although only force sensor 122 is shown in the example of FIGS. 3A and 3B, any suitable number of these devices may be utilized. In some examples, a piezoelectric device, which may be the piezoelectric element 202, may be utilized as a force sensor. In some examples, the force sensor 122 may be integrally coupled with the piezoelectric actuator assembly 200.

A pad 306 may be disposed on the force sensor 122 such that the pad 306, the force sensor 122, and the piezoelectric actuator assembly 200 are compressively stacked as shown in FIG. 3B. However, in other examples, the pad 306 may be disposed between the piezoelectric element 202b and the force sensor 122. The pad 306 may be compressible and may be composed of silicone, a hard rubber, polyester, polycarbonate and/or any other compressible or compliant material(s). The pad 306 provides at least minimal shock-absorbing or buffering protection for the piezoelectric actuator assembly 200, for example, in the event the portable electronic device 100 is dropped, resulting in a more resilient device 100. Further, the pad 306 does not substantially dampen the force applied to or on the touch-sensitive display 118. Additionally or alternatively, the pad 306 facilitates the focus of forces exerted on the touch-sensitive display 118 onto the force sensor 122. The pad 306 transfers forces between the touch-sensitive display 118 and the piezoelectric actuator assembly 200, whether the force sensor 122 is above or below the pad 306 and is advantageously flexible to facilitate provision of tactile feedback from the piezoelectric actuator assembly 200 to the touch-sensitive display 118. The pad 306 may also facilitate greater or more lax tolerances, such as mechanical tolerances, in assembling and manufacturing the portable electronic device 100 and its assemblies because the pad 306 may "absorb" unevenness in spacing between the force sensor 122, the piezoelectric actuator assembly 200 and/or the touch-sensitive display 118. The force sensor 122 may be optionally fastened to the pad 306, the piezoelectric actuator assembly 200, the housing 302 or any combination thereof. An adhesive, lamination, or other suitable measures/processes may be utilized as a fastening mechanism.

Although not shown, in some examples, absent an external force and/or absent a charge on the piezoelectric elements 202*a-d*, one or more of the piezoelectric elements 202*a-d* may be slightly bent due to a mechanical pre-load. The pre-load results in bent or curved piezoelectric elements 202*a-d*, such as a leaf spring, to facilitate provision of tactile feedback in a direction toward the touch-sensitive display 118 and in the opposite direction from the touch-sensitive display 118. Thus, tactile feedback to the touch-sensitive display 118 may simulate the depression and release of a physical key such as a key of a keyboard or a dome switch. For example, the pre-load of the piezoelectric actuator assembly 200 may result in a displacement of a center of the piezoelectric element 202*b* in the direction toward the housing 302 of between about 50 and 100 microns. Any other suitable pre-load or displacement may be utilized. The piezoelectric element 202*b* may be further displaced toward the housing 302 (e.g., 50 to 100 microns) when the touch-sensitive display 118 is depressed by an applied force that moves or pivots the touch-sensitive display 118 toward the housing 302. In some examples, the touch-sensitive display 118 compressively stacks the piezoelectric actuator assembly 200, force sensor 122, and pad 306 against a base or housing 302, resulting in a pre-load of the piezoelectric actuator assembly 200. In other examples, the substrate 206 and piezoelectric material 204 may be manufactured with a slight curve or pre-warp, for example, by curing the piezoelectric material 204 (e.g., a ceramic material) to the substrate 206 (e.g., a metal shim) with acrylic adhesive. The preload facilitates mechanical coupling between the piezoelectric actuator assembly 200 and the touch-sensitive display 118. The portable electronic device 100 may further include a biasing element disposed in the housing 302 to bias the touch-sensitive display 118 toward the piezoelectric actuator assembly 200 and pre-load the piezoelectric actuator assembly 200.

In operation, the touch-sensitive display 118 may be depressible, pivotable, and/or movable when force is applied to the touch-sensitive display 118. For example, the touch-sensitive display 118 may be movable between two or more positions by force exerted on the overlay 114 by a user when a user applies a force to the touch-screen display to select one or more graphics displayed on the touch-screen display. In response to the force on the overlay 114, the touch-sensitive display 118 may deflect away from the force, thereby causing the force sensor 122 to detect that the touch-sensitive display 118 has moved. This detection enables the portable electronic device 100 to determine that a user has selected one or more graphics displayed on the display 112. That is, a user may use his/her finger to highlight a graphic, an action which is detected by the overlay 114. Subsequently, when desiring to select or "click" the highlighted information, the user depresses the touch-sensitive display 118 using his/her finger. The depression of the touch-sensitive display 118, which is due to, for example, the force of a user's finger, is detected by the force sensor 122 and registered as a selection. When the touch-sensitive display 118 is depressed, the force sensor 122 generates a force signal that is received and interpreted by the microprocessor 102. The force sensor 122 detects a force imparted to the touch-screen display and generates the signal to the processor 102 via a conductive member coupled to the force sensor 122. The touch may be detected via, for example, a separate detector circuit which triggers or causes the processor 102 to activate the piezoelectric actuator assembly 200. However, in other examples, the example piezoelectric actuator assembly 200 can be used with a non-movable screen or touch sensitive display (e.g., a touch sensitive display that does not move relative to the housing 302).

The processor 102 then causes the piezoelectric actuator assembly 200 to activate to provide a tactile feedback (e.g., a vibration) to a user. More specifically, the processor 102 generates and provides an actuation signal to the piezoelectric actuator assembly 200 to provide tactile feedback to the touch-sensitive display 118. This tactile feedback allows a user to easily distinguish between a highlight action and a selection action when interacting with the portable electronic device 100. The piezoelectric actuator assembly 200 may be actuated by pressing anywhere on the touch-sensitive display 118.

The actuation signal includes duration, magnitude or intensity, and frequency of feedback information for the piezoelectric actuator assembly 200. The actuation signal may be based at least in part on the force or the force signal provided by the force sensor 122. The intensity of the feedback may be varied in relation to the amount of the applied force. The piezoelectric actuator assembly 200 may vibrate the touch-sensitive display 118 with respect to the housing 302. The touch-sensitive display 118 may vibrate, for example, at one or more frequencies between about 100 and 160 Hz. Alternatively, the touch-sensitive display 118 may vibrate at multiple frequencies, for example, vibrating at 50 Hz for a tenth of a second and then vibrating at 100 Hz for a tenth of a second. The piezoelectric actuator assembly 200 may be controlled to vibrate the touch-sensitive display 118 over various or varied distances. In other examples, the piezoelectric actuator assembly 200 may be controlled to vibrate the touch-sensitive display 118 across a varying frequency sweep, for example, 0 Hz to 150 Hz and back to 0 Hz in three tenths of a second. Other tactile feedback, such as pulses, clicks, or pops, may be provided by the piezoelectric actuator assembly 200.

The actuation signal causes, for example, the power source 142 to provide a charge (e.g., a voltage or current) to the piezoelectric actuator assembly 200. The processor 102 causes the power source 142 to apply a voltage or current to the piezoelectric elements 202*a-d* via the respective conductive traces 214*a-d* to operate the piezoelectric actuator assembly 200. More specifically, the voltage or current is applied to the piezoelectric elements 202*a-d* via the connector, which is electrically coupled to the substrate 206 (e.g., the shim or conductive layer) of the piezoelectric elements 202*a-d* via the conductive contacts 212*a-d* and the conductive traces 214*a-d*. Because each of the piezoelectric elements 202*a-d* are coupled to the connector via dedicated conductive traces 214a-d, each piezoelectric element 202a-d may be actuated or analyzed individually.

When a charge is applied to the piezoelectric actuator assembly 200, the substrate 206 bends when the piezoelectric material 204 (e.g., the PZT disk) contracts diametrically, as a result of buildup of charge at the piezoelectric material 204 or in response to a force, such as an external force applied to the touch-sensitive display 118. In particular, contraction of the piezoelectric material 204 applies a spring-like force, for example, opposing a force externally applied to the touch-sensitive display 118. The charge may be adjusted by varying the applied voltage, e.g., 150 V, or current via the respective conductive traces 214a-d, thereby controlling the force applied by each of the piezoelectric elements 202a-d. The charge on the piezoelectric elements 202a-d may be removed by a controlled discharge current that causes the piezoelectric material 204 to expand, thereby decreasing the force exerted by the substrate 206. The charge may advantageously be removed over a relatively short period of time to provide tactile feedback to the user via the touch-sensitive display 118. The pad 306 provides a bumper or cushion (e.g., a shock-absorber) for the piezoelectric actuator assembly 200.

The processor 102 may analyze and/or activate the piezoelectric elements 202a-d individually, simultaneously, intermittently, or in any delayed pattern or alternate combination. For example, the processor 102 may cause the piezoelectric element 202a to activate prior to activating the piezoelectric elements 202b-d. Thus, a charge or voltage may be applied independently to each of the piezoelectric elements 202a-d via the connector and the dedicated conductive traces 214a-d to operate or activate one or more of the plurality of piezoelectric elements 202a-d. For example, the first piezoelectric element 202a may receive a first charge (e.g., a first voltage) that may be different (e.g., greater) than a second charge (e.g., a second voltage) provided to the piezoelectric element 202b. In this manner, the piezoelectric element 202a may provide a first tactile feedback (e.g., a first force) to the user that is different than a second tactile feedback (e.g., a second force) provided by the piezoelectric element 202b. In another example, the piezoelectric elements 202a and 202c may be activated, and the piezoelectric elements 202b and 202d may be activated after a predetermined time interval from when the piezoelectric elements 202a and 202c where activated. Thus, the conductive contacts 212a-d are separately switchable to independently power any one of the plurality of piezoelectric elements 202a-d either independently, simultaneously, intermittently, in a delayed pattern, and/or in any other suitable pattern or combination.

The arrangement of piezoelectric actuator assembly 200 may be utilized to provide tactile feedback instead of a vibrator motor, for example, when a vibration is utilized to notify a user of an incoming phone call instead of a ring tone or other audible notification. Thus, a vibrator motor may be eliminated from the design of the portable electronic device 100. Further, the actuation signal may be varied according to the identity of a caller of a voice communication or sender of a voice communication, thereby providing a tailored notification.

The piezoelectric actuator assembly 200 may emulate the feel of a dome switch collapse and subsequent release, which is similar to simulating the press and release of a key of a keyboard. When a force exerted on the touch sensitive display 118 meets a first force threshold, an actuation signal may be sent to the piezoelectric actuator assembly 200 to simulate the collapse of a dome switch. When the force applied to the touch sensitive display 118 falls below a second force threshold, which may be lower than the first force threshold, an actuation signal may be sent to the piezoelectric actuator assembly 200 to simulate the release of a dome switch. Thus, each time a virtual or soft key is selected by depressing and releasing the touch-sensitive display 118 in accordance with force thresholds, tactile feedback simulating the press and release of a key is provided via the piezoelectric actuator assembly 200. Such feedback simulates typing on a keyboard comprised of physical keys. Similar or other feedback may be provided when a user selects other displayed options, such as decision windows, e.g., a displayed delete or unlock box. Feedback may be provided during the operation of a camera of a portable electronic device 100. For example, depression of the touch-sensitive display 118 may act as a shutter to take and record a digital picture, and the feedback may simulate the feel of a shutter press and release.

Feedback loops resulting from the triggering of the piezoelectric actuator assembly 200 due to forces applied by the piezoelectric actuator assembly 200 may be addressed in software, for example, by any combination of time delays, force thresholds conditions, and so forth.

The methods described herein may be carried out by software executed, for example, by the processor 102. Coding of software for carrying out such a method is within the scope of a person of ordinary skill in the art given the present description. A computer-readable medium having computer-readable code may be executed by at least one processor of the portable electronic device 100 to perform the methods described herein.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A piezoelectric actuator assembly to provide tactile feedback to a user of an electronic device, the piezoelectric actuator assembly comprising:
   a support plate having a recessed surface extending partially between a first side of the support plate and a second side of the support plate;
   a conductive contact directly attached to the recessed surface that provides an electrical connection to a piezoelectric element;
   the piezoelectric element having a first layer composed of an electrically conductive material and a second layer adjacent the first layer and composed of a piezoelectric material, the first layer composed of the electrically conductive material being sandwiched between the conductive contact and the second layer composed of the piezoelectric material, a bottom surface of the first layer of the piezoelectric element being directly in contact with a top surface of the conductive contact, and the second layer being on top of the first layer;
   a flexible conductive lead electrically coupling the second layer of the piezoelectric element to a ground; and
   wherein the support plate includes a conductive trace, the conductive trace connecting the conductive contact and a connector adjacent an edge of the support plate, wherein a voltage is applied to the piezoelectric element through the connector and the conductive trace, and the conductive trace is fixed on the support plate and different than the flexible conductive lead.

2. The piezoelectric actuator assembly of claim 1, wherein the support plate comprises a non-conducting material.

3. The piezoelectric actuator assembly of claim 2, wherein the non-conducting material comprises a plastic.

4. The piezoelectric actuator assembly of claim 1, wherein the support plate comprises a support layer composed of metal and an electrical insulating layer composed of plastic.

5. The piezoelectric actuator assembly of claim 4, wherein the recessed well is formed in the electrical insulating layer.

6. The piezoelectric actuator assembly of claim 1, wherein the support plate includes a plurality of recessed wells, a plurality of conductive contacts disposed within the respective recessed wells and a plurality of piezoelectric elements having their first layers directly coupled to the respective conductive contacts.

7. The piezoelectric actuator assembly of claim 1, wherein the conductive contact provides an electrical connection to the first layer of the piezoelectric element without a use of a flexible conductive lead.

8. A piezoelectric actuator assembly to provide tactile feedback to a user of an electronic device, the piezoelectric actuator assembly comprising:
   a support plate having a recessed well;
   a conductive contact positioned within the recessed well that provides an electrical connection to a piezoelectric element;
   the piezoelectric element having a first layer composed of an electrically conductive material and a second layer adjacent the first layer composed of a piezoelectric material, the first layer composed of the electrically conductive material being sandwiched between the conductive contact and the second layer composed of the piezoelectric material, the piezoelectric element being at least partially positioned within the recessed well so that a bottom surface of the first layer is directly in contact with a top surface of the conductive contact, and the second layer being on top of the first layer;
   a flexible conductive lead electrically coupling the second layer of the piezoelectric element to a ground, wherein one end of the flexible conductive lead extends from the support plate and the other end of the flexible conductive lead contacts the ground; and
   a conductive trace on the support plate, the conductive trace connecting the conductive contact and a connector adjacent an edge of the support plate, wherein a voltage is applied to the piezoelectric element through the connector and the conductive trace, and the conductive trace is different than the flexible conductive lead.

9. The piezoelectric actuator assembly of claim 8, wherein the support plate comprises a non-conducting material.

10. The piezoelectric actuator assembly of claim 8, wherein the support plate comprises a support layer composed of metal and an electrical insulating layer composed of plastic.

11. The piezoelectric actuator assembly of claim 10, wherein the recessed well is formed in the electrical insulating layer.

12. A piezoelectric actuator assembly to provide tactile feedback to a user of an electronic device, the piezoelectric actuator assembly comprising:
   a support plate having a recessed well partially extending through a thickness of the support plate;
   a conductive contact disposed within the recessed well that provides an electrical connection to a piezoelectric element;
   a conductive trace integrally formed on the support plate, the conductive trace between the conductive contact and a connector adjacent an outer perimeter of the support plate;
   the piezoelectric element having a first layer composed of an electrically conductive material and a second layer adjacent the first layer and composed of a piezoelectric material, the first layer composed of the electrically conductive material being sandwiched between the conductive contact and the second layer composed of the piezoelectric material, and the piezoelectric element being disposed within the recessed well so that a bottom surface of the first layer is directly in contact with a top surface of the conductive contact, the second layer being on top of the first layer wherein a voltage is applied to the piezoelectric element through the connector and the conductive trace; and
   a flexible conductive lead electrically coupling the second layer of the piezoelectric element to a ground, wherein one end of the flexible conductive lead extends from the support plate and the other end of the flexible conductive lead contacts the ground and the flexible conductive lead is different than the conductive trace.

13. The piezoelectric actuator assembly of claim 12, wherein the support plate electrically isolates or insulates the piezoelectric element from another piezoelectric element to be positioned on the support plate.

14. The piezoelectric actuator assembly of claim 12, wherein the connector is coupled to the piezoelectric element via the conductive trace formed on the support plate.

15. A piezoelectric actuator assembly to provide tactile feedback to a user of an electronic device, the piezoelectric actuator assembly comprising:
   a support plate having a plurality of recessed wells;
   a plurality of conductive contacts disposed within the respective recessed wells, wherein each conducive contact provides an electrical connection to at least one of a plurality of piezoelectric elements; and
   the plurality of piezoelectric elements having a first layer composed of an electrically conductive material and a second layer adjacent the first layer and composed of a piezoelectric material, the first layer composed of the electrically conductive material being sandwiched between the conductive contact and the second layer composed of the piezoelectric material, the second layer being on top of the first layer, and the plurality of piezoelectric elements being disposed within the plurality of recessed wells and having their first layer directly coupled to the plurality of conductive contacts and between the plurality of conductive contacts and their second layer, and the second layers electrically coupled to a ground via a flexible conductive lead, the plurality of conductive contacts being separately switchable to independently power one of the plurality of piezoelectric elements via a plurality of conductive traces between the respective conductive contacts and a connector adjacent an outer edge of the support plate, the plurality of conductive traces different than the flexible conductive lead, and at least one voltage applied to the plurality of piezoelectric elements through the connector and the plurality of conductive traces.

16. The piezoelectric actuator assembly of claim 15, wherein the connector couples the plurality of conductive traces to a microprocessor.

17. The piezoelectric actuator assembly of claim 16, wherein each of the conductive traces provides a dedicated electrical trace between the respective conductive contacts and the connector.

18. A mobile device comprising:
a housing;
a user interface; and
an actuator assembly disposed between the housing and the user interface and being operatively coupled to the user interface to provide tactile feedback to a user, the actuator assembly comprising:
a chassis having a plurality of recessed wells, the plurality of recessed wells forming a plurality of recessed surfaces;
a plurality of conductive contacts supported by the plurality of recessed surfaces of the plurality of recessed wells, wherein each conducive contact provides an electrical connection to at least one of a plurality of piezoelectric elements;
the plurality of piezoelectric elements each having a conductive layer directly in contact with the plurality of conductive contacts, the conductive layers of the piezoelectric elements being sandwiched between the plurality of conductive contacts and piezoelectric material, the piezoelectric material being on top of the conductive layers, and the chassis configured to electrically isolate or insulate a first piezoelectric element of the plurality of piezoelectric elements from a second piezoelectric element of the plurality of piezoelectric elements;
a flexible conductive lead electrically coupling the piezoelectric material of the plurality of piezoelectric elements to a ground; and
a plurality of conductive traces between the respective conductive contacts and a connector at an outer edge of the chassis, the plurality of conductive traces different than the flexible conductive lead, each of the plurality of conductive traces providing a dedicated electrical trace between the respective conductive contacts and a connector, and at least one voltage applied to the plurality of piezoelectric elements through the connector and the plurality of conductive traces.

19. The mobile device of claim 18, wherein the user interface comprises a touch-sensitive screen or a keypad.

20. The mobile device of claim 19, wherein the touch-sensitive screen comprises a liquid crystal display (LCD).

21. A mobile device comprising:
a housing;
a user interface; and
an actuator assembly disposed between the housing and the user interface and being operatively coupled to the user interface to provide tactile feedback to a user, the actuator assembly comprising:
a chassis having a plurality of recessed wells;
a plurality of conductive contacts disposed within the plurality of recessed wells, wherein each conducive contact provides an electrical connection to at least one of a plurality of piezoelectric elements;
the plurality of piezoelectric elements each having a conductive layer directly in contact with the plurality of conductive contacts, the conductive layers of the piezoelectric elements being sandwiched between the plurality of conductive contacts and a piezoelectric material, the piezoelectric material being on top of the conductive layers, the chassis including a plurality of conductive traces to electrically couple the conductive layer of the plurality of piezoelectric elements and the conductive contacts to a connector adjacent an outer perimeter of the chassis, wherein at least one voltage is applied to the plurality of conductive contacts independently via the connector and the plurality of conductive traces to actuate one or more of the plurality of piezoelectric elements; and
a flexible conductive lead electrically coupling the piezoelectric material of the plurality of piezoelectric elements to a ground, the flexible conductive lead different than the plurality of conductive traces.

22. The mobile device of claim 21, wherein a first piezoelectric element from the plurality of piezoelectric elements is activated to provide a first tactile feedback that is different than a tactile feedback provided by a second piezoelectric element from the plurality of piezoelectric elements.

23. The mobile device of claim 21, wherein the conductive layers of the plurality of piezoelectric elements are coupled to the conductive contacts positioned on the chassis to provide an electrical connection to the plurality of piezoelectric elements.

24. A method for electrically coupling a piezoelectric actuator assembly, the method comprising:
forming a support plate with a plurality of recessed wells;
positioning a plurality of conductive contacts within the plurality of recessed wells, wherein each conducive contact provides an electrical connection to at least one of a plurality of piezoelectric elements;
directly coupling a conductive layer of the plurality of piezoelectric elements to the plurality of conductive contacts such that the conductive layer is directly in contact with the plurality of conductive contacts, the conductive layer of the piezoelectric elements being sandwiched between a piezoelectric material of the plurality of piezoelectric elements and the plurality of conductive contracts, the piezoelectric material being on top of the conductive layer, and the plurality of conductive contacts providing an electrical connection to the piezoelectric elements without using a flexible conductive lead;
forming a plurality of conductive traces on the support plate, the plurality of conductive traces between the respective conductive contacts and a connector at an outer edge of the support plate, and at least one voltage applied to the plurality of piezoelectric elements through the connector and the plurality of conductive traces; and
coupling the piezoelectric material of the plurality of piezoelectric elements to a ground via a flexible conductive lead, the flexible conductive lead different than the plurality of conductive traces.

25. The method of claim 24, further comprising applying the voltage to a first piezoelectric element of the plurality of piezoelectric elements independently from a second piezoelectric element of the plurality of piezoelectric elements.

26. The method of claim 24, further comprising integrally forming the plurality of conductive contacts with the support plate.

27. The method of claim 24, further comprising providing a first voltage to a first piezoelectric element from the plurality of piezoelectric elements to provide a first tactile feedback and providing a second voltage to a second piezoelectric element from the plurality of piezoelectric elements to provide a second tactile feedback that is different than the first tactile feedback.

28. A method for electrically coupling a piezoelectric actuator assembly, the method comprising:
  forming a support plate with a recessed well defining a recessed surface;
  coupling a conductive contact to the recessed surface of the recessed well, wherein the conductive contact provides an electrical connection to a piezoelectric element;
  directly coupling a conductive layer of the piezoelectric element to the conductive contact such that a bottom surface of the conductive layer is directly in contact with a top surface of the conductive contact, the conductive layer of the piezoelectric element being sandwiched between a piezoelectric material of the piezoelectric element and the conductive contact, and the piezoelectric material of the piezoelectric element being on top of the conductive layer of the piezoelectric element;
  coupling the piezoelectric material of the piezoelectric element to a ground via a flexible conductive lead; and
  integrally forming a conductive trace on the support plate between the conductive contact and a connector adjacent an edge of the support plate, wherein a voltage is applied to the piezoelectric element through the connector and the conductive trace, and the conductive trace is different than the flexible conductive lead that extends from the support plate to the ground.

* * * * *